United States Patent
Ripley et al.

(10) Patent No.: US 8,666,337 B2
(45) Date of Patent: Mar. 4, 2014

(54) SYSTEM AND METHOD FOR POWER AMPLIFIER CONTROL SATURATION DETECTION AND CORRECTION

(75) Inventors: David S. Ripley, Marion, IA (US); Paul R. Andrys, Swisher, IA (US); Matthew L. Banowetz, Marion, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 419 days.

(21) Appl. No.: 13/039,771

(22) Filed: Mar. 3, 2011

(65) Prior Publication Data

US 2011/0218020 A1 Sep. 8, 2011

Related U.S. Application Data

(60) Provisional application No. 61/310,745, filed on Mar. 5, 2010.

(51) Int. Cl.
*H01Q 11/12* (2006.01)
*H04B 1/04* (2006.01)

(52) U.S. Cl.
USPC ............... 455/127.1; 455/194.2; 455/571; 330/285

(58) Field of Classification Search
USPC .......... 455/127.1–127.3, 194.1, 194.2, 550.1, 455/571–574; 330/278, 285
See application file for complete search history.

(56) References Cited

U.S. PATENT DOCUMENTS

| | | | |
|---|---|---|---|
| 5,589,796 A * | 12/1996 | Alberth et al. | 330/133 |
| 6,038,432 A * | 3/2000 | Onoda | 455/127.2 |
| 6,430,402 B1 * | 8/2002 | Agahi-Kesheh | 455/115.3 |
| 6,718,165 B1 * | 4/2004 | Ha | 455/234.2 |
| 7,082,290 B2 * | 7/2006 | Takano et al. | 455/102 |
| 2005/0046474 A1 | 3/2005 | Matsumoto et al. | |
| 2006/0186955 A1 | 8/2006 | Quilter | |
| 2007/0291872 A1 | 12/2007 | Chan et al. | |
| 2009/0280758 A1 | 11/2009 | Pratt et al. | |
| 2010/0009642 A1 | 1/2010 | Pratt et al. | |

OTHER PUBLICATIONS

International Search Report and Written Opinion, re International Application No. PCT/US2011/027186, dated Oct. 28, 2011.

* cited by examiner

*Primary Examiner* — Nhan Le
(74) *Attorney, Agent, or Firm* — Knobbe, Martens, Olson & Bear, LLP

(57) ABSTRACT

A system for power amplifier control saturation detection and correction includes a comparator configured to receive a power control signal and a detected power signal and generate a regulated voltage, a power amplifier configured to receive the regulated voltage and develop an output power, a power detector configured to sense the output power and develop the detected power signal, a saturation detector configured to receive the regulated voltage and a system voltage and determine whether the power amplifier is operating in a saturation mode during a transmit burst, and a current generator configured to reduce the power control signal when the power control signal exceeds a predetermined value and after expiration of a predetermined period of time, preventing the power control signal from exceeding the detected power signal.

18 Claims, 9 Drawing Sheets

SYSTEM AND METHOD FOR POWER AMPLIFIER CONTROL SATURATION DETECTION AND CORRECTION

CROSS-REFERENCE TO RELATED APPLICATION

This application claims priority to and the benefit of the filing date of U.S. Provisional Patent Application No. 61/310,745, filed on Mar. 5, 2010, entitled "GMSK Power Control Saturation Detection And Correction," the entire disclosure of which is hereby incorporated herein by reference.

BACKGROUND

Portable communication devices, such as cellular telephones, personal digital assistants (PDAs), WiFi transceivers, and other communication devices transmit and receive communication signal at various frequencies that correspond to different communication bands and at varying power levels. Each of these devices uses a power amplifier to amplify the information signal for over-the-air transmission. One such power amplifier topology is referred to a collector voltage amplitude controller (COVAC). One technology used to implement a COVAC power amplifier uses one or more bipolar junction transistor (BJT) or heterojunction bipolar transistor (HBT) stages to implement the power amplifier, while the supply voltage is provided to the collector of the power amplifier using control circuitry that can be fabricated using a complementary metal oxide semiconductor (CMOS) process.

A typical COVAC power amplifier implementation can be used to transmit a signal that is modulated using Gaussian mean shift keying (GMSK) as the transmit methodology. GMSK power amplifiers are quite prevalent in portable handheld communication devices. The control circuitry associated with such a power amplifier typically receives a power control signal that is provided from an external source, such as a baseband system that is coupled to the power amplifier. The power output of the power amplifier is proportional to the level of the power control signal.

In general, it is desirable that the relationship between the power control signal and the power output of the power amplifier be linear, and under many operating conditions, this is the case. However, in some operating conditions, it is possible for the relationship between the power control signal and the power output of the power amplifier to become non-linear. One such operating condition is when the power amplifier becomes saturated. As an example, the power amplifier can become saturated under low battery conditions, or if a relatively high voltage standing wave ratio (VSWR) exists at the output of the power amplifier. When saturated, the power amplifier's internal power control loop gain-bandwidth decreases, resulting in high level switching transients on the falling edge of a transmit burst. When the power amplifier becomes saturated, it no longer responds in a linear manner to the power control signal.

Therefore, it would be desirable to detect the point at which a power amplifier becomes saturated, and to correct for such saturation.

SUMMARY

Embodiments of a system for power amplifier control saturation detection and correction include a comparator configured to receive a power control signal and a detected power signal and generate a regulated voltage, a power amplifier configured to receive the regulated voltage and develop an output power, a power detector configured to sense the output power and develop the detected power signal, a saturation detector the power amplifier is operating in a saturation mode during a transmit burst, and a current generator configured to reduce the power control signal when the power control signal exceeds a predetermined value and after expiration of a predetermined period of time, preventing the power control signal from exceeding the detected power signal.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable communication device, such as a portable cellular telephone or a personal digital assistant (PDA), the system and method for power amplifier control saturation detection and correction can be used in any device or system that has a COVAC power amplifier. The system and method for power amplifier control saturation detection and correction can be implemented as part of an integrated module that contains other circuit elements, or can be implemented as a discrete circuit within a power amplification control module. Further, while described herein as applicable to a power amplification system using GMSK modulation, the system and method for power amplifier control saturation detection and correction can be implemented with power amplification systems that employ other modulation techniques.

In an embodiment, the system and method for power amplifier control saturation detection and correction can be implemented in hardware. The hardware implementation of the system and method for power amplifier control saturation detection and correction can include any or a combination of the following technologies, which are all well known in the art: discrete electronic components, integrated electronic components, a discrete logic circuit(s) having logic gates for implementing logic functions upon data signals, an application specific integrated circuit having appropriate logic gates, a programmable gate array(s) (PGA), a field programmable gate array (FPGA), etc.

Figure 1:
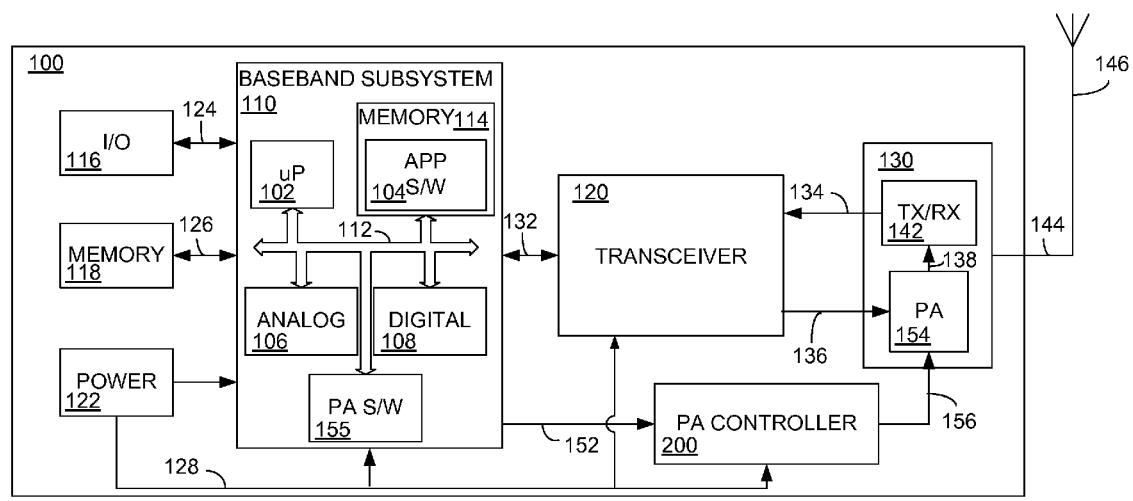
FIG. 1 is a block diagram illustrating a simplified portable communication device.

FIG. 1 is a block diagram illustrating a simplified portable communication device 100. In an embodiment, the portable communication device 100 can be a portable cellular telephone. Embodiments of the system and method for power amplifier control saturation detection and correction can be implemented in any device having a COVAC RF power amplifier, and in this example, are implemented in a portable communication device 100. The portable communication device 100 illustrated in FIG. 1 is intended to be a simplified example of a cellular telephone and to illustrate one of many possible applications in which the system and method for power amplifier control saturation detection and correction can be implemented. One having ordinary skill in the art will understand the operation of a portable cellular telephone, and, as such, implementation details are not shown herein. The portable communication device 100 includes a baseband subsystem 110, a transceiver 120, a front end module (FEM) 130 and a power amplifier controller 200. Although not shown for clarity, the transceiver 120 generally includes modulation and upconversion circuitry for preparing a baseband information signal for amplification and transmission, and includes filtering and downconversion circuitry for receiving and downconverting an RF signal to a baseband information signal to recover data. The details of the operation of the transceiver 120 are known to those skilled in the art.

The baseband subsystem 110 generally includes a processor 102, which can be a general purpose or special purpose microprocessor, memory 114, application software 104, analog circuit elements 106, digital circuit elements 108, and power amplifier software 155, coupled over a system bus 112. The system bus 112 can include the physical and logical connections to couple the above-described elements together and enable their interoperability.

An input/output (I/O) element 116 is connected to the baseband subsystem 110 over connection 124, a memory element 118 is coupled to the baseband subsystem 110 over connection 126 and a power source 122 is connected to the baseband subsystem 110, transceiver 120 and power controller 200 over connection 128. The I/O element 116 can include, for example, a microphone, a keypad, a speaker, a pointing device, user interface control elements, and any other devices or system that allow a user to provide input commands and receive outputs from the portable communication device 100.

The memory 118 can be any type of volatile memory, non-volatile memory, or a combination thereof, and in an embodiment, can include flash memory. The memory element 118 can be permanently installed in the portable communication device 100, or can be a removable memory element, such as a removable memory card, or a combination of fixed and removable memory.

The power source 122 can be, for example, a battery, or other rechargeable power source, or can be an adaptor that converts AC power to the correct voltage used by the portable communication device 100.

The processor 102 can be any processor that executes the application software 104 to control the operation and functionality of the portable communication device 100. The memory 114 can be volatile memory, non-volatile memory, or a combination thereof, and in an embodiment, can be non-volatile memory that stores the application software 104. If portions of the system and method for power amplifier control saturation detection and correction are implemented in software, then the baseband subsystem 110 also includes power amplifier software 155 that can be stored in the memory 114 and executed by the microprocessor 102, or by another processor, which may cooperate with control logic to control the operation of at least portions of the power amplifier controller 200 to be described below.

The analog circuitry 106 and the digital circuitry 108 include the signal processing, signal conversion, and logic that convert an input signal provided by the I/O element 116 to an information signal that is to be transmitted. Similarly, the analog circuitry 106 and the digital circuitry 108 include the signal processing, signal conversion, and logic that convert a received signal provided by the transceiver 120 to an information signal that contains recovered information. The digital circuitry 108 can include, for example, a digital signal processor (DSP), a field programmable gate array (FPGA), or any other processing device. Because the baseband subsystem 110 includes both analog and digital elements, it is sometimes referred to as a mixed signal device (MSD).

In an embodiment, the front end module 130 includes a transmit/receive (TX/RX) switch 142 and a power amplifier 154. The TX/RX switch 142 can be a duplexer, a diplexer, or any other physical or logical device or circuitry that separates a transmit signal and a receive signal. Depending on the implementation of the portable communication device 100, the TX/RX switch 142 may be implemented to provide half-duplex or full-duplex functionality. A transmit signal provided by the transceiver 120 over connection 136 is directed to the power amplifier 154. The output of the power amplifier 154 is provided over connection 138 to the TX/RX switch 142, and then to an antenna 146 over connection 144.

The power amplifier controller 200 includes circuitry and logic that controls the power output of the power amplifier 154. In an embodiment, the power amplifier controller 200 receives a power control signal, which can be referred to as Vramp, from the baseband subsystem 110 over connection 152. The power control signal on connection 152 can be implemented in a variety of ways, and generally comprises an analog or a digital control signal that allows the power amplifier controller 200 to set the power of an output signal from the power amplifier 154. In an embodiment, the power amplifier controller 200 also includes circuitry to determine whether the power amplifier is operating in a saturated condition, and if so, to correct for the saturated condition. Embodiments of the power amplifier controller 200 will be described in greater detail below.

A signal received by the antenna 146 is provided over connection 144 to the TX/RX switch 142, which provides the received signal over connection 134 to the transceiver 120. The received signal is provided over connection 132 to the baseband subsystem 110 for further processing.

Figure 2:
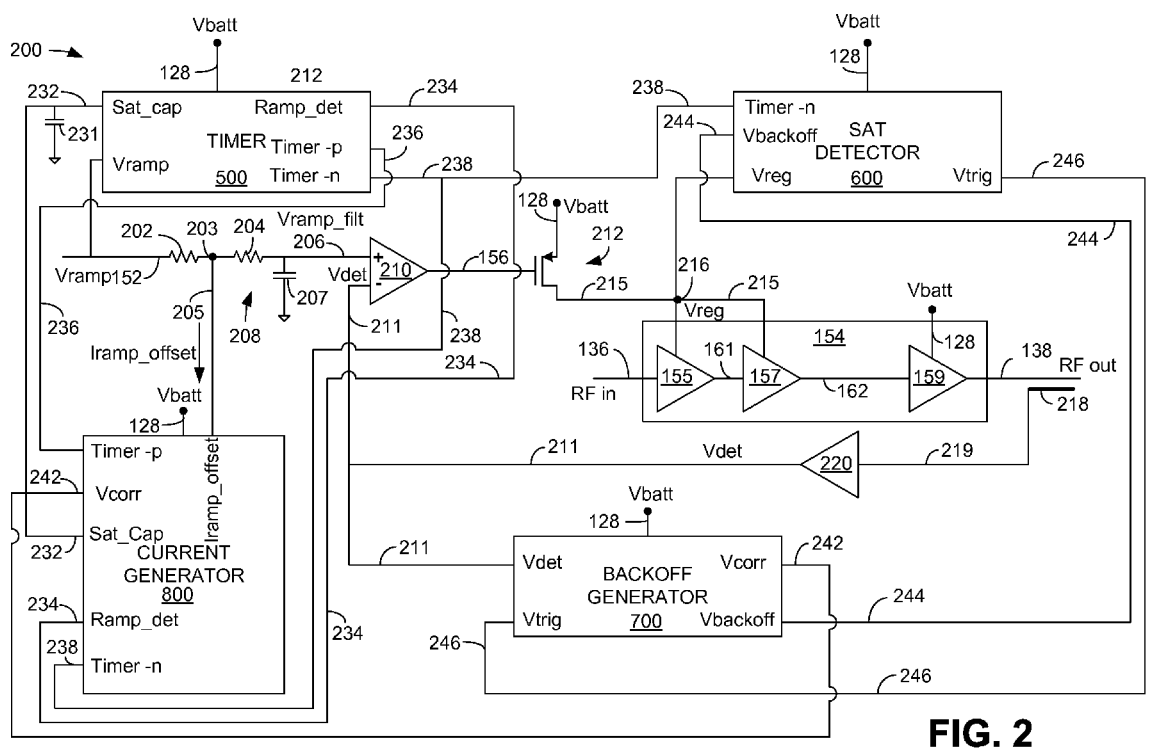
FIG. 2 is a functional block diagram illustrating an embodiment of the power amplifier and power amplifier control system of FIG. 1.

FIG. 2 is a functional block diagram illustrating an embodiment of the power amplifier 154 and power amplifier controller 200 of FIG. 1. FIG. 2 illustrates only the portions of the power amplifier controller 200 that are relevant to the description of the system and method for power amplifier control saturation detection and correction. The power amplifier controller 200 comprises a number of circuit elements illustrated using functional blocks. The functional blocks can be implemented in a variety of ways using a variety of logic elements. An example implementation of each of the circuit elements illustrated in FIG. 2 will be described in further detail below. However, other implementations are possible.

The power amplifier controller 200 includes a timer 500, a saturation detector 600, a backoff generator 700, and a current generator 800. The power amplifier controller 200 controls the power amplifier 154, which is illustrated in this embodiment as a three stage power amplifier. The power amplifier controller 200 also comprises an integrator 210 and a power detector 220.

The power amplifier 154 comprises a first stage 155, a second stage 157 and an output stage 159. The first stage 155 and the second stage 157 are typically referred to as "driver stages," while the output stage 159 is also sometimes referred to as the "final" stage.

A power control signal, referred to as "Vramp" is applied over connection 152 through a resistor 202 and a filter 208 comprising a resistor 204 and a capacitor 207. The Vramp signal appears as a filtered control signal "Vramp_filt" on connection 206.

In an embodiment, the filter 208 has a cutoff frequency of approximately 335 KHz 3 dB, which is adequate for suppressing quarter bit step transition transients in an associated digital-to-analog converter (DAC). If coarser DAC step sizes are used, an optional external Vramp filter (not shown) may be added for additional transient suppression.

The Vramp_filt signal on connection 206 is provided to the non-inverting input of the integrator 210. The integrator can be implemented using an operational amplifier. A signal, "Vdet," that is proportional to the output power of the power amplifier 154 is provided from the power detector 220 over connection 211 to the inverting input of the integrator 210. The output of the integrator 210 on connection 156 is provided to the gate terminal of a transistor device 212. The source of the transistor device 212 is connected to battery voltage on connection 128, and the drain of the transistor device 212 is a regulated voltage, Vreg, which is connected over connection 215 to respective control terminals of the amplifier stages 155 and 157. In an embodiment in which the power amplifier 154 is implemented using bipolar junction transistor (BJT) devices, or another variant of BJT technology, the node 216 is connected to the respective collector terminals of the devices 155 and 157 over connections 215.

A radio frequency (RF) input signal, RF in, is provided over connection 136 to the power amplifier 154. The RF input signal on connection 136 is amplified by the driver stage 155 and then provided over connection 161 to the second driver stage 157. The output of the driver stage 157 is provided over connection 162 to the output stage 159. The RF output of the output stage 159 is provided over connection 138 as the RF output signal that is to be transmitted. The collector terminal of the output stage 159 is connected to battery voltage over connection 128.

A portion of the output power on connection 138 is diverted using a power coupler 218 and is provided over connection 219 as an input to the power detector 220. In an embodiment, the power detector 220 can be implemented as a log detector, a diode detector, or any other type of power detector. The output of the power detector 220 on connection 211 is the detector signal, Vdet, and is proportional to the output power on connection 138. The Vdet signal on connection 211 is provided to the integrator 210 and is also provided to the backoff generator 700.

The timer 500 receives battery voltage over connection 128 and receives a capacitor saturation signal, Sat_cap, on connection 232. A capacitor 231 is charged by the Sat_cap signal on connection 232 when the timer 500 is operating, as will be described below. The Vramp signal on connection 152 is also provided to the timer 500. A ramp detect signal, Ramp_det, is provided on connection 234, a positive timer signal, timer-p, is provided over connection 236, and a negative timer signal, timer-n, is provided over connection 238.

The saturation detector 600 receives battery voltage over connection 128, receives the timer-n signal on connection 238, receives a backoff signal, Vbackoff, on connection 244, receives the regulated voltage signal Vreg over connection 215, and provides a voltage trigger signal, Vtrig, over connection 246.

The backoff generator 700 receives battery voltage over connection 128, receives the power detect signal, Vdet, over connection 211, receives the trigger signal, Vtrig, over connection 246, provides the backoff voltage signal, Vbackoff, over connection 244 and provides a voltage correction signal, Vcorr, over connection 242.

The current generator 800 receives battery voltage over connection 128, receives the timer-p signal over connection 236 and receives the timer-n signal over connection 238. The current generator 800 also receives the correction voltage signal, Vcorr, over connection 242, provides the Sat_cap signal over connection 232 and receives the ramp detect signal, Ramp_det, over connection 234.

In accordance with an embodiment of the system and method for power amplifier control saturation detection and correction, the current generator 800 generates and sinks a current, Iramp_offset, over connection 205 from the Vramp signal 152.

Figure 3:
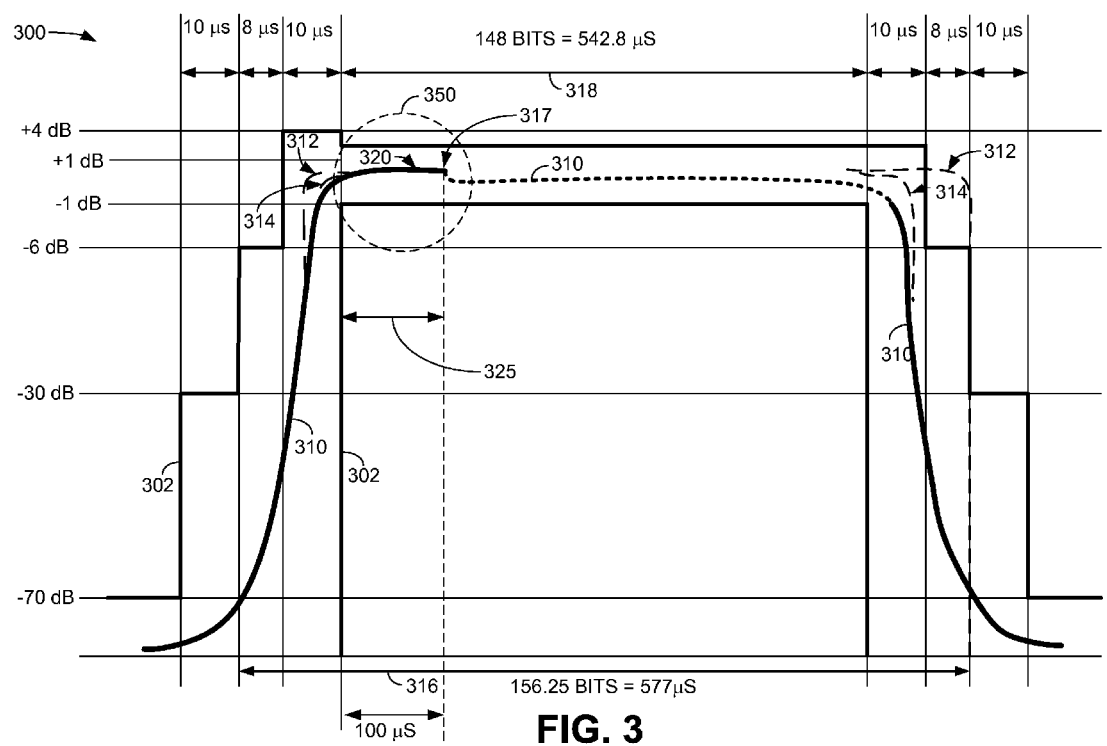
FIG. 3 is a graphical representation of the power output of the power amplifier of FIG. 1 during a typical output burst.

FIG. 3 is a graphical representation of the power output of the power amplifier 154 during a typical output burst 300. The curve 310 illustrates the desired power output of the power amplifier 154. A transmit spectrum mask 302 defines the power and time parameters within which the curve 310 must remain to comply with regulatory requirements. As shown in FIG. 3, the curve 310 indicates that output power remains below −70 dB until the beginning of the burst 300. In this example, the burst time is 156.25 bits, which corresponds to 577 μs and is indicated using reference numeral 316. The portion of the burst in which data is transmitted is 148 bits in duration, which corresponds to 542.8 μs, and is indicated using reference numeral 318. The ramp up of the curve 310 occurs in the 18 μs preceding the beginning of the period 318 and the ramp down of the curve 310 occurs in the 18 μs after the period 318. The curve 312, indicated with a dotted line, indicates a deeply saturated power amplifier and the curve 314, also indicated with a dotted line, indicates a minimally saturated power amplifier. The curves 312 and 314 illustrate two exemplary saturation conditions of the power amplifier 154 (FIG. 2).

In accordance with an embodiment of the system and method for power amplifier control saturation detection and correction, when the Vramp signal exceeds a nominal 1.0V, a measurement of a predetermined period of time at the beginning of the transmit burst 300 is begun. The predetermined period of time is illustrated as time period 325, which is the initial period of the portion 318 of the transmit burst 300, and can be measured using the timer 500 (FIG. 2). The predetermined period of time allows for the power output of the power amplifier 154 (FIG. 2) to stabilize and settle to a nominal desired power level so that when power correction is initiated from a steady operating point the power correction accurately removes the saturation condition. This predetermined period of time can be a nominal 100 μs, or can be a different period of time, depending on system implementation and length of the transmit burst 300. Continually during the period 325, the power amplifier 154 is repeatedly tested for saturation. However, even if power amplifier saturation is detected during the predetermined period of time 325, power correction is delayed until the end of the predetermined period of time 325 to ensure that a false saturation detection did not occur due to settling of the power amplifier operating conditions.

When Vramp exceeds approximately 1.0V, the timer 500, which in an embodiment can be set to a duration of 100 μsec, is initiated. After the timer 500 has completed, the power output is decreased by a nominal 0.5 dB. The nominal decrease in power of 0.5 dB is shown as being initiated at point 317. Saturation is again repeatedly checked after the point 317, and during the balance of the portion 318 of the transmit burst 300. The nominal 0.5 dB decrease in power that is initiated at point 317 is shown for illustrative purposes only. The power decrease that is initiated during the transmit burst 300 after the power output of the power amplifier stabilizes (after 100 μs as in this example) is chosen based on a particular power amplifier implementation. The predetermined period of time 325 and the amount of power decrease are chosen based on operating parameters and system design parameters. For example, in an embodiment, the predetermined period of time 325 can vary by about 5-20 μs and the power decrease can vary between about 0.3 dB and 0.8 dB. Regardless of whether saturation is detected during the period 325, in the embodiment described herein, the power output of the power amplifier is reduced by a nominal 0.5 dB after a 100 μs predetermined period of time 325 for each transmit burst 300.

To achieve the power reduction, the Vramp_filt signal is reduced by subtracting a linearly increasing voltage offset from the applied Vramp signal at node 203. This voltage offset is created by sinking a linearly increasing offset current (Iramp_offset is less than 100 uA) across the filter 208 over connection 205. The power control reference voltage Vramp_filt decreases with time until the approximately 0.5 dB power reduction target is met at which point the current Iramp_offset on connection 205 is held constant until Vramp decreases below ~0.9V or a power amplifier enable high-to-low transition occurs. For multi-slot GMSK-to-GMSK operation, transitioning Vramp below approximately 0.9V between slots is used to reset the saturation detection/correct function for correct operation in the following slot.

Figure 4:
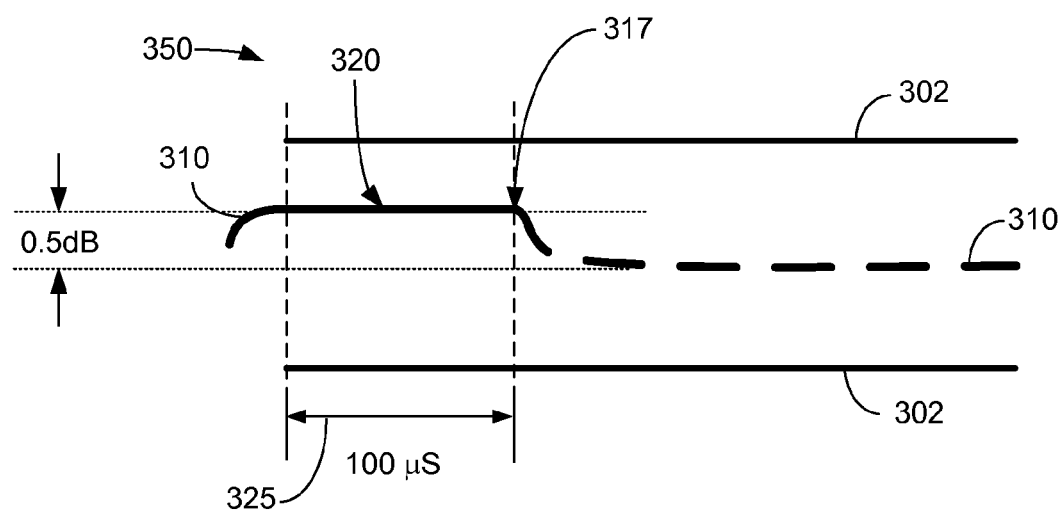
FIG. 4 is a graphical representation of a portion of the output burst of FIG. 3.

FIG. 4 is a graphical representation of a portion 350 of the output burst of FIG. 3. A portion of the spectrum mask 302 is shown for reference. The curve 310 represents the nominal output of the power amplifier. The portion 320 of the curve 310 illustrates the normal power output of the power amplifier 154 during the period 325 when the power may fluctuate before stabilizing. The point 317 is the point at which the power output of the power amplifier 154 is sufficiently stable and the power is reduced by a nominal 0.5 dB, as described above. In accordance with an embodiment of the system and method for power amplifier control saturation detection and correction, maintaining the power output approximately 0.5 dB below the nominal power output exhibited at the end of the period 325 allows the power amplifier 154 to remain out of saturation for the remainder of the portion 318 of the transmit burst 300 so that the ramp down of the power output can be accomplished linearly at the end of the portion 318 of the transmit burst 300 (FIG. 3).

Figure 5:
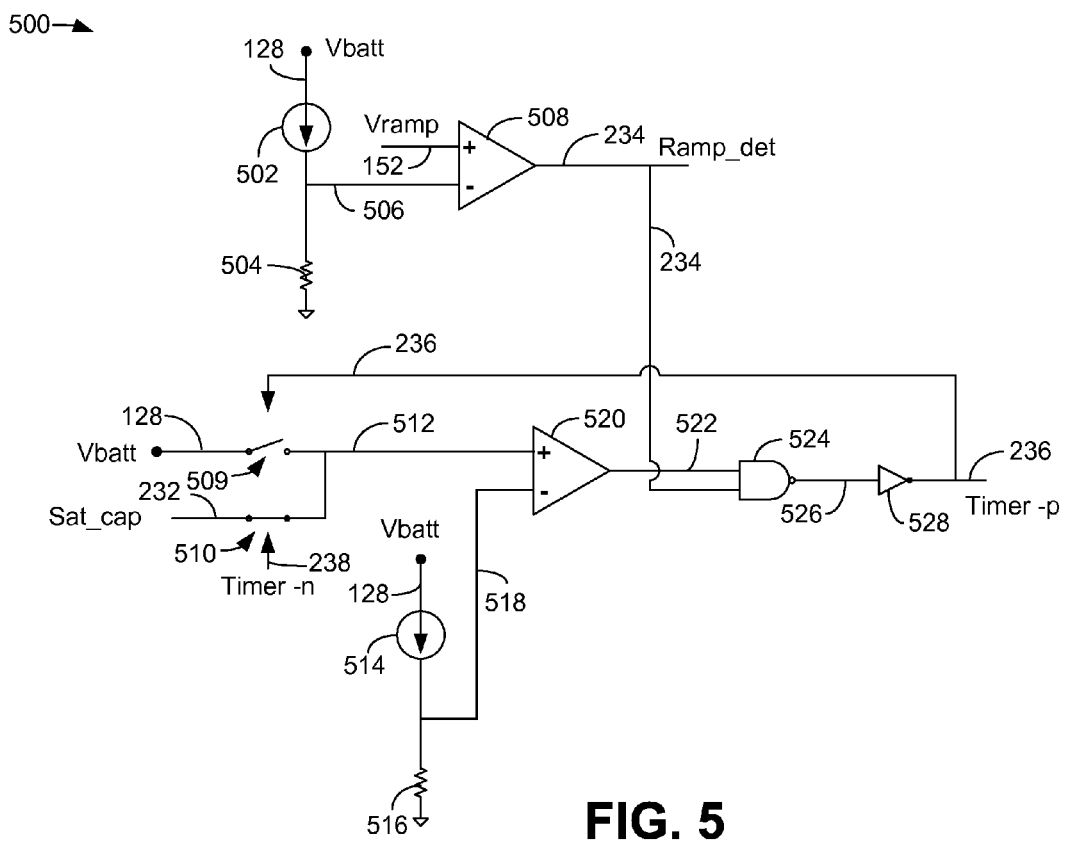
FIG. 5 is a schematic diagram illustrating an embodiment of the timer of FIG. 2.

FIG. 5 is a schematic diagram illustrating an embodiment of the timer 500 of FIG. 2. The timer 500 includes a comparator 508, implemented using an operational amplifier, which receives the Vramp signal at its non-inverting input over connection 152. Battery voltage, Vbatt, is provided over connection 128 to a current source 502. The current source 502 is connected to ground through a resistor 504. The output of the current source 502 on connection 506 is provided to the inverting input of the comparator 508. The output of the comparator 508 is the ramp detect signal, Ramp_det, on connection 234.

The battery voltage, Vbatt, is also provided over connection 128 to a switch 509. The switch 509 is controlled by the positive timer signal, timer-p, on connection 236. The saturation signal, Sat_cap, is provided over connection 232 to a switch 510. The switch 510 is controlled by the negative timer signal, timer-n, on connection 238. The output of the switch 509 and the output of the switch 510 are provided on connection 512 as an input to the non-inverting input of a comparator 520. The comparator 520 can be implemented using an operational amplifier. The battery voltage, Vbatt, is provided over connection 128 to a current source 514, which is connected to ground through a resistor 516. The output of the current source 514 on connection 518 is provided to the inverting input of the comparator 520.

The output of the comparator 520 over connection 522 provides an input to a logic gate 524, which is implemented as a NAND gate. The other input to the NAND gate 524 is the Ramp_det signal on connection 234. The output of the NAND gate 524 on connection 526 is provided as an input to an inverter 528. The output of the inverter 528 is the timer-p signal on connection 236.

Figure 6:
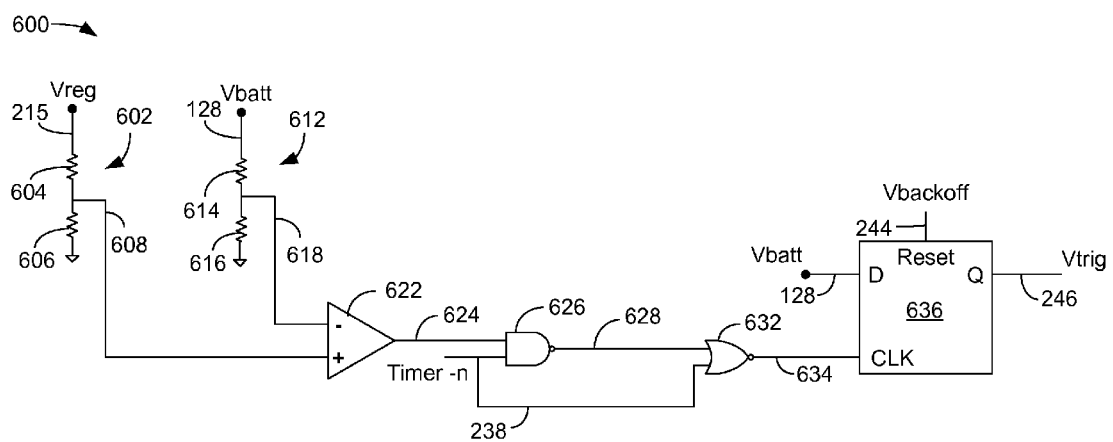
FIG. 6 is a schematic diagram illustrating an embodiment of the saturation detector of FIG. 2.

FIG. 6 is a schematic diagram illustrating an embodiment of the saturation detector 600 of FIG. 2. The saturation detector 600 comprises a voltage divider 602 and a voltage divider 612. The voltage divider 602 receives the regulated voltage, Vreg, over connection 215 and provides a voltage output on connection 608 between the resistor 604 and the resistor 606. The output on connection 608 is provided to the non-inverting input of a comparator 622, which can be implemented using an operational amplifier. The comparator 622 latches when saturation of the power amplifier is detected during the period 318 (FIG. 3) and provides the trigger signal, Vtrig, to the backoff generator 700.

The voltage divider 612 receives battery voltage over connection 128 and provides a voltage on connection 618 between the resistor 614 and the resistor 616. The output on connection 618 is provided to the inverting input of the comparator 622.

The output of the comparator 622 on connection 624 is provided to one input of a logic gate 626. The logic gate 626 can be implemented using a NAND gate. The other input to the NAND gate 626 is the negative timer signal, timer-n, on connection 238. The output of the NAND gate 626 on connection 628 is provided to a logic gate 632. The logic gate 632 can be implemented using a NOR gate. The other input to the NOR gate 632 is the timer-n signal provided over connection 238. The output of the NOR gate 632 is provided over connection 634 as a clock input to a DQ flip-flop 636. Battery voltage, Vbatt, is provided to the flip-flop 636 over connection 128, while the reset input receives the backoff voltage, Vbackoff, on connection 244. The flip-flop 636 provides the trigger signal, Vtrig, over connection 246.

Figure 7:
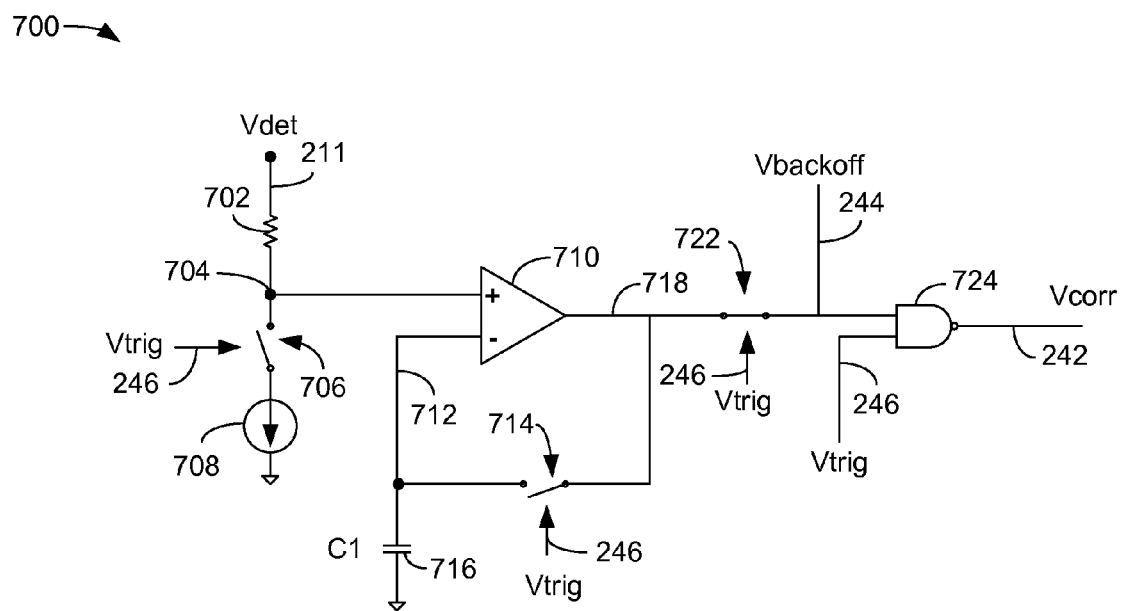
FIG. 7 is a schematic diagram illustrating an embodiment of the backoff generator of FIG. 2.

FIG. 7 is a schematic diagram illustrating an embodiment of the backoff generator 700 of FIG. 2. The backoff generator 700 includes a device 710. The device 710 receives a voltage signal from a node 704. The detector voltage, Vdet, provided by the power detector 220 (FIG. 2) is provided on connection 211 through a resistor 702. The trigger voltage, Vtrig, is provided as a control signal over connection 246 and controls a switch 706 coupled to a current source 708. The non-inverting input of the device 710 receives the voltage signal on connection 704.

The inverting input 712 of the device 710 is coupled to a capacitor 716. The capacitor 716 charges to a voltage referred to as "Vdetect_offset." The output of the device 710 is provided over connection 718 to a switch 714. The switch 714 is controlled by the trigger signal, Vtrig, and is used to charge the capacitor 716. During the time that the switch 714 is closed, the device 710 acts as an operational amplifier with unity gain feedback. During the time that the switch 714 is open, the device 710 acts as a comparator.

The output of the device 710 on connection 718 is provided to a switch 722. The switch 722 is controlled by the trigger signal, Vtrig, on connection 246. The output of the switch 722 is the backoff voltage, Vbackoff, on connection 244 and is also provided as a first input to a logic gate 724. The logic gate 724 can be implemented using a NAND gate. The other input to the NAND gate 724 is the trigger signal, Vtrig, on connection 246. The output of the NAND gate 724 is the correction voltage signal, Vcorr, on connection 242 provided to the current generator 800.

Figure 8:
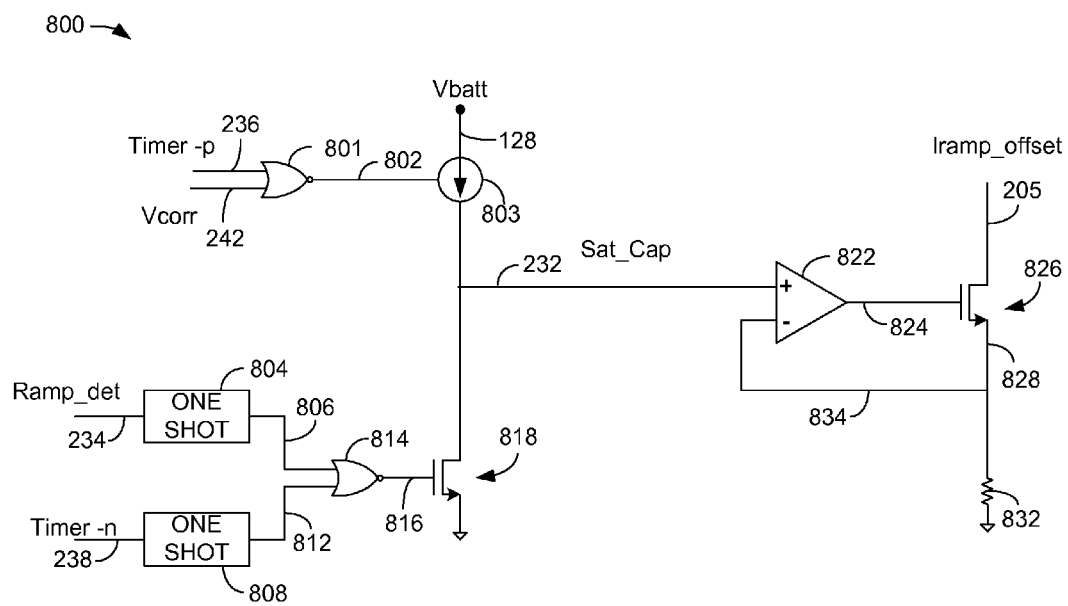
FIG. 8 is a block diagram illustrating an embodiment of the ramp generator of FIG. 2.

FIG. 8 is a block diagram illustrating an embodiment of the current generator 800 of FIG. 2. The current generator 800 includes a logic gate 801, which can be implemented as a NOR gate. The NOR gate 801 receives the positive timer signal, timer-p, on connection 236 and receives the correction voltage, Vcorr, on connection 242. The output of the NOR gate 801 on connection 802 is provided to a current source 803. The battery voltage, Vbatt, is also provided to the current source 803 on connection 128.

The ramp detect signal, Ramp_det, is provided over connection 234 to a one-shot element 804. The one-shot element 804 is responsive to the first rising edge of the Ramp_det signal on connection 234 and will not respond to any additional transitions of the Ramp_det signal until it is reset. The output of the one-shot element 804 is provided over connection 806 as a first input to a logic gate 814. The logic gate 814 can be implemented using a NOR gate.

The negative timer signal, timer-n, is provided over connection 238 to a one-shot element 808. The one-shot element 808 is responsive to the first rising edge of the timer-n signal on connection 238 and will not respond to any additional transitions of the timer-n signal until it is reset. The output of the one-shot element 808 on connection 812 is provided as the other input to the NOR gate 814. The output of the NOR gate 814 on connection 816 is provided to the gate terminal of a transistor 818. The source of the transistor 818 is coupled to ground and the drain of the transistor 818 is coupled to the current source 803, providing the Sat_cap signal on connection 232. The current source 803 provides the Sat_cap signal on connection 232 to charge the capacitor 231 (FIG. 2).

The Sat_cap signal is provided over connection 232 as the non-inverting input to an operational amplifier 822. The output of the operational amplifier 822 is provided over connection 824 to a gate of a transistor 826. The current, Iramp_offset, is drawn over connection 205 and provided to the drain of the transistor 826. The source 828 of the transistor 826 is coupled through a resistor 832 to ground and also provides the input over connection 834 to the inverting input of the comparator 822.

Figure 9:
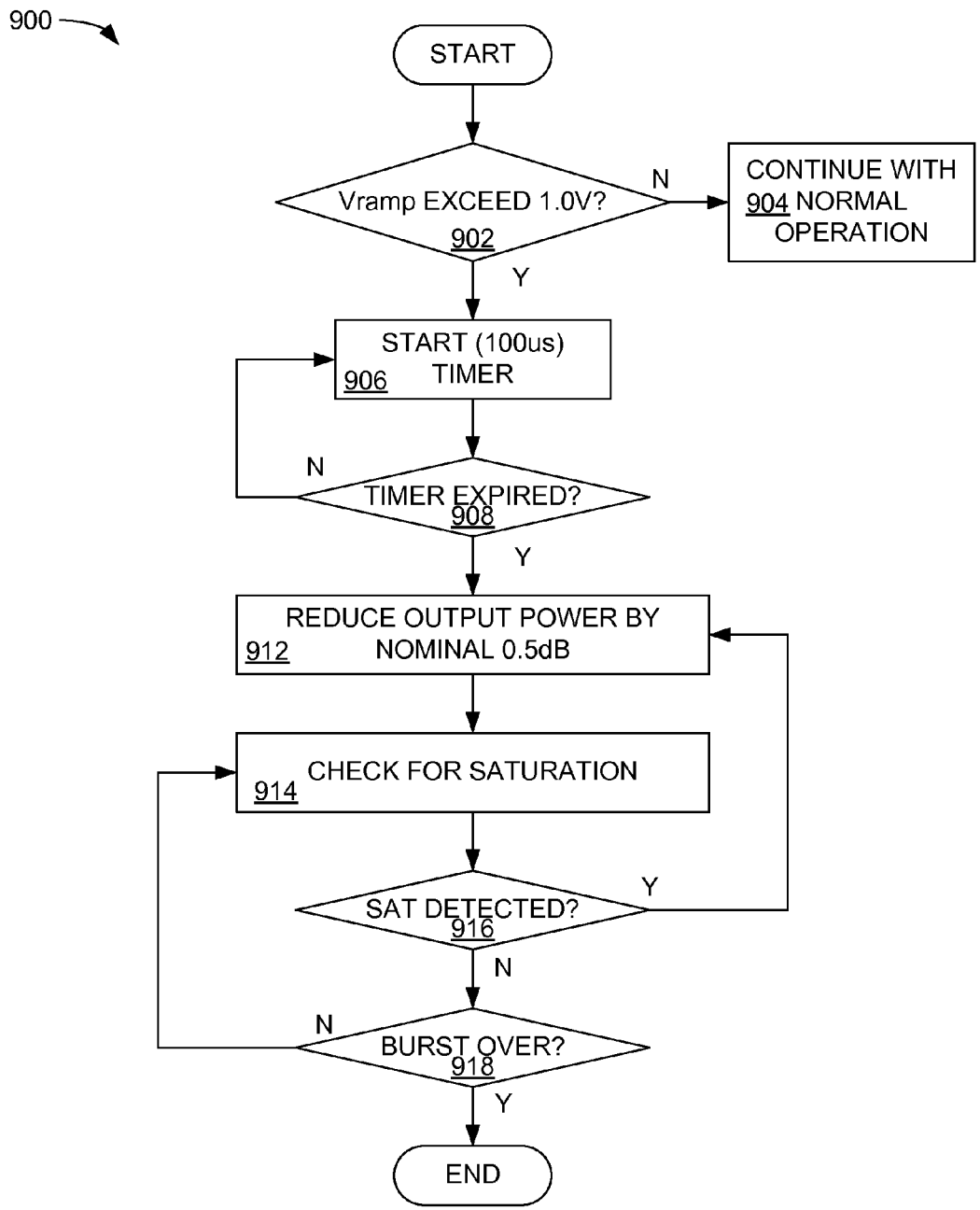
FIG. 9 is a flowchart illustrating an embodiment of the method for power amplifier control saturation detection and correction.

FIG. 9 is a flowchart 900 illustrating an embodiment of the method for power amplifier control saturation detection and correction. In block 902 is determined whether the voltage Vramp exceeds 1.0V. If Vramp does not exceed 1.0V then the process proceeds to block 904 and normal amplifier operation proceeds per block 904.

If the Vramp voltage exceeds 1.0V, then, in block 906, the timer 500 is started and begins timing a nominal 100 µs predetermined period of time. Other timer durations are possible and depend on system implementation. Further, a 100 µs timer duration corresponds to a duty cycle of approximately 17%. However, as Vramp exceeds the voltage corresponding to a nominal rated output power (~1.85V), the correction duty cycle will increase from 100 µsec/577 µsec (17%) to 100%. As the applied Vramp is increased beyond that used for nominal rated power, the internal voltage, Vramp_filt, which references the internal power amplifier control loop, is further decreased using the offset current, Iramp_offset, to pull the control loop out of saturation. Since the internal pullback time constant is fixed, this action consumes additional time and results in increasing correction duty cycle. For Vramp greater than ~2.2V, which is beyond the normal operating region of the power amplifier 154, the duty cycle is ~100% and the saturation detection/correction circuitry is no longer active.

Under low battery and/or voltage standing wave ratio (VSWR) power amplifier load conditions, where the saturated power amplifier output power (Psat) has decreased, the correction duty cycle will also increase beyond the nominal 17%. The internal voltage, Vramp_filt, is then decreased below the lower Vramp@Psat value to pull the control loop out of saturation. Since the internal pullback time constant is fixed, this action consumes additional time or longer correction duty cycle.

In block 908 it is determined whether the 100 µs timer 500 has elapsed. If the timer 500 has not elapsed, the timer continues to run in block 906. When the timer 500 elapses, then, in block 912 the power output is reduced by a nominal 0.5 dB if the value of Vramp still exceeds 1.0V. The voltage, Vramp_filt is lowered by using the Iramp_offset current to sink current from the node 203 (FIG. 2) until the power output (Vdetect) is equal to the Vdetect—the voltage across capacitor 716 of FIG. 7. Essentially, the voltage Vramp_filt is decreased until the Vramp_filt equals Vdet.

In block 914 saturation is checked using the saturation detector 600 (FIG. 6). If saturation is detected in block 916, then, in block 912, the power output is again reduced by a nominal 0.5 dB if the value of Vramp still exceeds 1.0V, as described above.

If, in block 916, it is determined that saturation is not detected, then, in block 918, it is determined whether the end of the burst (300, FIG. 3) has been reached. If the end of the burst has not been reached, then the process returns to block 914 and saturation is again checked. If the end of the burst is reached, the process ends.

While various embodiments of the invention have been described, it will be apparent to those of ordinary skill in the art that many more embodiments and implementations are possible that are within the scope of the invention. For example, the invention is not limited to a specific type of communication device or transceiver. Embodiments of the invention are applicable to different types of communication devices and transceivers.

What is claimed is:

1. A system for power amplifier control saturation detection and correction, comprising:

a comparator configured to receive a power control signal and a detected power signal and generate a regulated voltage;

a power amplifier configured to receive the regulated voltage and develop an output power;

a power detector configured to sense the output power and develop the detected power signal;

a saturation detector configured to receive the regulated voltage and a system voltage and determine whether the power amplifier is operating in a saturation mode during a transmit burst; and a current generator configured to reduce the power control signal when the power control signal exceeds a predetermined value and after expiration of a predetermined period of time, preventing the power control signal from exceeding the detected power signal.

2. The system of claim 1 wherein the current generator generates an offset current that is subtracted from the power control signal when the power control signal exceeds a predetermined value.

3. The system of claim 1 wherein the saturation detector determines power amplifier saturation repeatedly during the transmit burst.

4. The system of claim 1 wherein reducing the power control signal results in a decrease of 0.3 dB to 0.8 dB in output power.

5. The system of claim 3 further comprising subsequently reducing the power control signal when saturation is detected after the predetermined period of time.

6. The system of claim 5 wherein subsequently reducing the power control signal results in an additional decrease of 0.3 dB to 0.8 dB in output power.

7. A method for power amplifier control saturation detection and correction, comprising:
   receiving a power control signal and a detected power signal;
   responsive to the power control signal and detected power signal, generating a regulated voltage;
   providing the regulated voltage to a power amplifier configured to develop an output power;
   sensing the output power and developing the detected power signal;
   receiving the regulated voltage and a system voltage and responsive thereto determining whether the power amplifier is operating in a saturation mode during a transmit burst; and
   reducing the power control signal when the power control signal exceeds a predetermined value and after expiration of a predetermined period of time, preventing the power control signal from exceeding the detected power signal.

8. The method of claim 7 wherein reducing the power control signal further comprises generating an offset current that is subtracted from the power control signal when the power control signal exceeds a predetermined value.

9. The method of claim 7 further comprising repeatedly determining whether the power amplifier is operating in a saturation mode during the transmit burst.

10. The method of claim 7 wherein reducing the power control signal comprises a decrease of 0.3 dB to 0.8 dB in output power.

11. The method of claim 9 wherein when saturation is detected after the predetermined period of time, further reducing the power control signal.

12. The method of claim 11 wherein further reducing the power control signal results in a further decrease of 0.3 dB to 0.8 dB in output power.

13. A portable communication device, comprising:
   a transceiver;
   a comparator configured to receive a power control signal and a detected power signal and develop a regulated voltage;
   a power amplifier configured to receive the regulated voltage and generate an output power;
   a power detector configured to sense the output power and develop the detected power signal;
   a saturation detector configured to receive the regulated voltage and a system voltage and determine whether the power amplifier is operating in a saturation mode during a transmit burst; and
   a current generator configured to reduce the power control signal when the power control signal exceeds a predetermined value and after expiration of a predetermined period of time, preventing the power control signal from exceeding the detected power signal.

14. The portable communication device of claim 13 wherein the current generator generates an offset current that is subtracted from the power control signal when the power control signal exceeds a predetermined value.

15. The portable communication device of claim 13 wherein the saturation detector determines power amplifier saturation repeatedly during the transmit burst.

16. The portable communication device of claim 13 wherein reducing the power control signal results in a decrease of 0.3 dB to 0.8 dB in output power.

17. The portable communication device of claim 15 further comprising subsequently reducing the power control signal when saturation is detected after the predetermined period of time.

18. The portable communication device of claim 17 wherein subsequently reducing the power control signal results in an additional decrease of 0.3 dB to 0.8 dB in output power.

* * * * *